(12) United States Patent
Leigh et al.

(10) Patent No.: US 10,539,753 B1
(45) Date of Patent: Jan. 21, 2020

(54) LIQUID-COOLED ASSEMBLY

(71) Applicant: HEWLETT PACKARD ENTERPRISE DEVELOPMENT LP, Houston, TX (US)

(72) Inventors: Kevin B. Leigh, Houston, TX (US); Sunil Rao Ganta Papa Rao Bala, Cypress, TX (US); John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/175,977

(22) Filed: Oct. 31, 2018

(51) Int. Cl.
*G02B 6/42* (2006.01)
*H01L 23/40* (2006.01)
*H01L 23/473* (2006.01)
*H01R 13/627* (2006.01)
*H01R 12/71* (2011.01)
*H01R 13/631* (2006.01)

(52) U.S. Cl.
CPC ......... *G02B 6/4268* (2013.01); *G02B 6/4261* (2013.01); *G02B 6/4278* (2013.01); *G02B 6/4292* (2013.01); *H01L 23/40* (2013.01); *H01L 23/473* (2013.01); *H01R 12/716* (2013.01); *H01R 13/6273* (2013.01); *H01R 13/631* (2013.01)

(58) Field of Classification Search
CPC .......................... G02B 6/4269; G02B 6/42698
See application file for complete search history.

(56) References Cited

U.S. PATENT DOCUMENTS

| 5,473,506 | A | 12/1995 | Kikinis |
| 6,269,001 | B1 | 7/2001 | Matteson et al. |
| 6,393,853 | B1 | 5/2002 | Vukovic et al. |
| 6,410,850 | B1 * | 6/2002 | Abel .................... G02B 6/3897 174/60 |
| 7,212,409 | B1 | 5/2007 | Belady et al. |
| 7,372,702 | B2 | 5/2008 | Gauche et al. |

(Continued)

OTHER PUBLICATIONS

ASUS USA, "Intel Z270 EATX gaming motherboard with water-cooling monoblock, dual M.2, Aura Sync RGB LEDs, DDR4 4133MHz, Thunderbolt 3, 802.11ac Wi-Fi, and USB 3.1 Type-A/C," 2018, pp. 1-37 (online), Retrieved from the Internet on May 29, 2018 at URL: <asus.com/us/Motherboards/ROG-MAXIMUS-IX-EXTREME/>.

(Continued)

*Primary Examiner* — Omar R Rojas
(74) *Attorney, Agent, or Firm* — Nolte Intellectual Property Law Group (57) ABSTRACT

The present disclosure provides a liquid-cooled transceiver assembly. The liquid-cooled transceiver assembly comprises a removable communications module and a receiving bay assembly. The removable communications module includes a faceplate connector to receive a signal from an external device, a signal conversion chip that is coupled to the faceplate connector, and a lever assembly. The lever assembly can engage the receiving bay assembly such that the signal conversion chip is aligned with and makes an electrical connection with an electrical socket disposed on the receiving bay assembly. The removable communications module is inserted into the receiving bay assembly which when fully assembled functions as a liquid-cooled transceiver assembly.

19 Claims, 5 Drawing Sheets

(56) References Cited

U.S. PATENT DOCUMENTS

| | | | |
|---|---|---|---|
| 7,420,808 | B2 | 9/2008 | Campbell et al. |
| 7,626,820 | B1 | 12/2009 | Konshak et al. |
| 7,869,215 | B2 | 1/2011 | Hung et al. |
| 7,961,465 | B2 | 6/2011 | Goldrian et al. |
| 8,000,103 | B2 | 8/2011 | Lipp et al. |
| 8,755,179 | B2 | 6/2014 | Alyaser et al. |
| 8,760,870 | B2 * | 6/2014 | Yamamoto ............ G02B 6/4201 165/80.2 |
| 9,158,348 | B2 | 10/2015 | Berk et al. |
| 9,852,963 | B2 | 12/2017 | Shedd et al. |
| 9,900,101 | B2 | 2/2018 | Leigh et al. |
| 2015/0160702 | A1 | 6/2015 | Franz et al. |
| 2017/0142864 | A1 | 5/2017 | Chanu et al. |
| 2017/0164518 | A1 * | 6/2017 | Morgan .................. G06F 1/181 |

OTHER PUBLICATIONS

Mack et al., "Pluggable Optics Modules—Thermal Specifications, Part 1", available online at <electronics-cooling.com/2016/07/pluggable-optics-modules-thermal-specifications-part-1/>, Jul. 7, 2016, pp. 1-12.

\* cited by examiner

LIQUID-COOLED ASSEMBLY

BACKGROUND

Air-cooling systems have been found to suitably cool several high-power electronics devices. However, for some electronics devices such as network switch line-cards and other high-power devices that consume hundreds of watts of power, air cooling may be insufficient. As such, liquid cooling systems have been employed as an alternative means to effectively cool high-power electronic systems.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements, and in which.

DETAILED DESCRIPTION

The description of the different advantageous implementations has been presented for purposes of illustration and is not intended to be exhaustive or limited to the implementations in the form disclosed. Many modifications and variations will be apparent to those of ordinary skill in the art. Further, different advantageous implementations may provide different advantages as compared to other advantageous implementations. The implementation or implementations selected are chosen and described in order to best explain the principles of the implementations, the practical application, and to enable others of ordinary skill in the art to understand the disclosure for various implementations with various modifications as are suited to the particular use contemplated.

Before the present disclosure is described in detail, it is to be understood that, unless otherwise indicated, this disclosure is not limited to specific procedures or articles, whether described or not. It is further to be understood that the terminology used herein is for the purpose of describing particular implementations only and is not intended to limit the scope of the present disclosure.

It must be noted that as used herein, and in the claims, the singular forms "a," and "the" include plural referents unless the context clearly dictates otherwise.

Hot-pluggable transceiver modules, such as a C form-factor pluggable (CFP), Small form-factor pluggable (SFP), Quad small form-factor (QSFP), etc., experience challenges to cool and often occupy a significant amount of space on a module board. This may limit the use of other electronic components on the same module board and may also increase the cooling resource needs that would otherwise be directed to the transceiver device or the module board which increases the overall energy consumption of the device in which the module board is coupled (e.g., in a switch device). In addition, a transceiver module may be coupled to a module board via right-angle electrical blind-mate connectors which also occupies significant space on a module board and thereby limits vertical stacking of transceiver modules which restricts the implementation of high lane-count transceivers (e.g., greater than 8 lanes). Traditional use of right-angle electrical blind-mate connectors in conjunction with relatively long trace lengths on a transceiver module base board requires signal conditioning devices on either the module board or on a transceiver module base board for high-speed signals (e.g., greater than 25 Gbps/lane) thus increasing power consumption, board real estate, and implementation costs.

Further, liquid cooling systems that incorporate liquid blind-mates can increase system costs and expose computing systems to leaks. Moreover, manually connecting liquid lines on faceplates of systems may minimize leak risks but can expose liquid lines to external electrical and/or optical cables which present ease-of-use challenges. Accordingly, a need exists for a high-power liquid cooling system that is compact, easy to use, and minimizes liquid leak risks at a relatively low cost.

The present disclosure describes liquid cooling of an electro-optical system that employs a heat-extraction device in a receiving assembly where an electro-optical system is installed. As will be described in more detail in this disclosure, the liquid-cooled transceiver assembly described herein may be equipped with a heat sink, cold-plate device, and liquid lines. The liquid-cooled transceiver assembly is, in some implementations, high-density and does not require large heat sinks. The liquid-cooled transceiver assembly may also incorporate a "hot-pluggable" removable communications module which enables a transceiver assembly to be added to an operating computer system without causing significant interruption. Advantageously, the liquid-cooled transceiver assembly disclosed herein is configured to accept any of various transceiver modules to provide different device functionality.

In some implementations, the removable communications module may be a high lane-count optical transceiver module, (e.g., 16 lanes, 24 lanes, 32 lanes, etc.) that has a relative large pin-count (i.e., large number of electrical pins to interface power, management and data signals to the system). In other examples, the removable communications module may be a computing device (e.g., System-on-Chip, Graphic Processing Unit, Artificial Intelligence, or accelerator chip) that has a large pin count.

Figure 1:
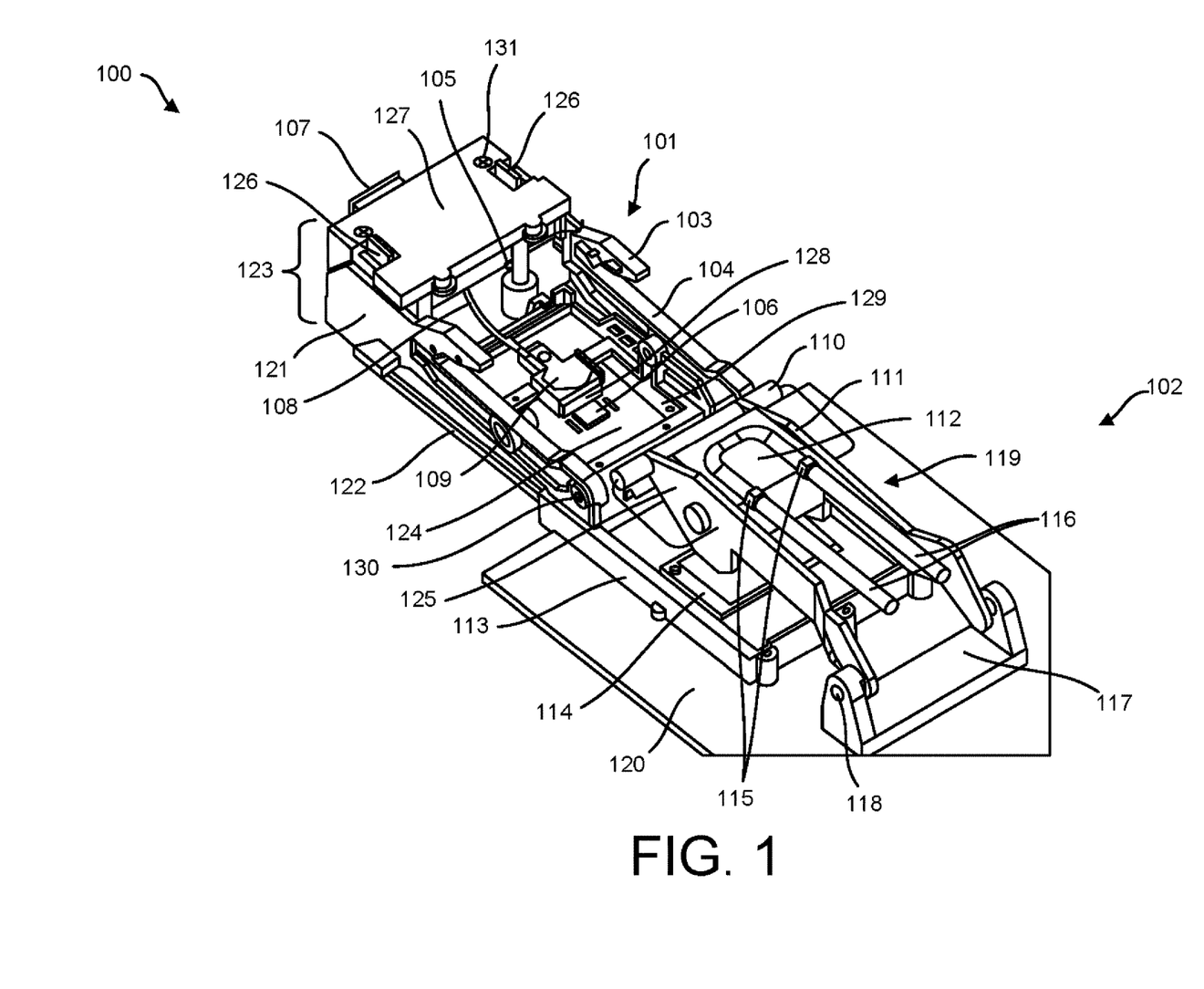
FIG. 1 is an illustration of a perspective view of a partially-assembled liquid-cooled transceiver assembly according to one implementation of the present disclosure.

FIG. 1 is an illustration of a perspective view of a partially-inserted liquid-cooled transceiver assembly 100 according to one implementation of the present disclosure. As shown, liquid-cooled transceiver assembly 100 includes a "hot-pluggable" assembly 101 and a receiving bay assembly 102. A hot-pluggable assembly 101 is defined herein as a device that can be added to a computer system without causing any significant interruption. Typically, adding a hot-pluggable assembly 101 to a computer system does not require a system restart.

The hot-pluggable assembly 101 is equipped with a faceplate connector 107 (e.g., electrical or optical) and a signal conversion chip 106 (electrical or electro-optical). The faceplate connector 107 may comprise interface signals for an Ethernet network, InfiniBand fabric, Gen Z fabric connector, NVLink GPU communication link, etc., to communicatively couple the hot-pluggable assembly 101 to an external system, network, or device.

In some implementations, faceplate connector 107 is fashioned to mate with an external cable (e.g., a communication cable) such that signals can be communicated between the faceplate connector 107 and the external cable. The signal conversion chip 106 may be connected to the faceplate connector 107 such that signals may be communicated therebetween. The signal conversion chip 106 may be configured to convert or transform signals communicated with the faceplate connector 107. For example, the signal conversion chip 106 may be an electro-optical transceiver device, which transforms optical signals from an optical cable mated with the faceplate connector 107 into electrical signals that are routed to a component of a computing system, and visa versa. As another example, the signal conversion chip 106 may convert electrical signals of one type into electrical signals of another type, such as by changing communications format of the signals, or multiplexing/de-multiplexing the signals. For simplicity, the following description will focus on examples in which the signal conversion chip 106 is an electro-optical transceiver 106. However, the present disclosure is not limited thereto. In some examples, the signal conversion chip 106 is an electro-optical transceiver which may have a thermal interface material disposed thereon. In some implementations, the faceplate connector 107 may be configured for an external cable that may connect to a network switch linecard or standard QSFP, QSFP-DD, or OSFP transceiver-compliant device to be connected thereto.

The signal conversion chip 106 may be a component of and implemented on a co-packaged assembly 124 (e.g., System-on-Chip) which hosts a chip optical connector 109, lasers, and photodetectors (lasers and photodetectors not shown) on a top side. The co-packaged assembly 124 may electrically couple to the module board 129 via soldering pads where the soldering pads may carry electrical high-speed signals, electrical power, and electrical management signals. The signal conversion chip 106 may convert the electrical high-speed signals received via the soldering pads to optical signals by means of the lasers. The converted optical signals may be transmitted to the chip optical connector 109. Similarly, the optical signals from the chip optical connector 109 may be received by the signal conversion chip 106 via the photodetectors, and the converted electrical signals may be sent to the soldering pads to further interface to the system. In some implementations, signal conversion chip 106 disclosed on the co-packaged assembly 124 may be a field programmable gate array (FPGA), graphical processing unit (GPU), or other accelerator or dedicated hardware.

In some implementations, signal conversion chip 106 may be disposed on a substrate (e.g., a glass substrate or an organic substrate) of a co-packaged assembly 124. In addition, lasers and photodetectors may be located on the same substrate so as to be mechanically aligned with an optical socket 128 such that they are capable of sending and receiving optical signals to and from a chip optical connector 109 that is mated with the optical socket 128. The signal conversion chip 106 electrically drives the lasers to emit light signals that are optically coupled into the chip optical connector 109 which are transmitted by an optical fiber jumper 108 to the faceplate connector 107 (and from there to an external cable if one is mated to the faceplate connector 107). Conversely, optical signals received by the faceplate connector 107 from an external cable are transmitted by the optical fiber jumper 108 to the chip optical connector 109 and then are optically coupled to the photodetectors. As such, the optical fiber jumper 108 and chip optical connector 109 facilitates communication of optical signals between the faceplate connector 107 and the signal conversion chip 106. It should be understood by one having ordinary skill in the art having this disclosure that the present disclosure is not limited to a single chip optical connector 109 but may include two or more chip optical connectors 109. Similarly, the present disclosure is not limited to a single faceplate connector 107 but may include two or more faceplate connectors 107.

Figures 5A, 5B:
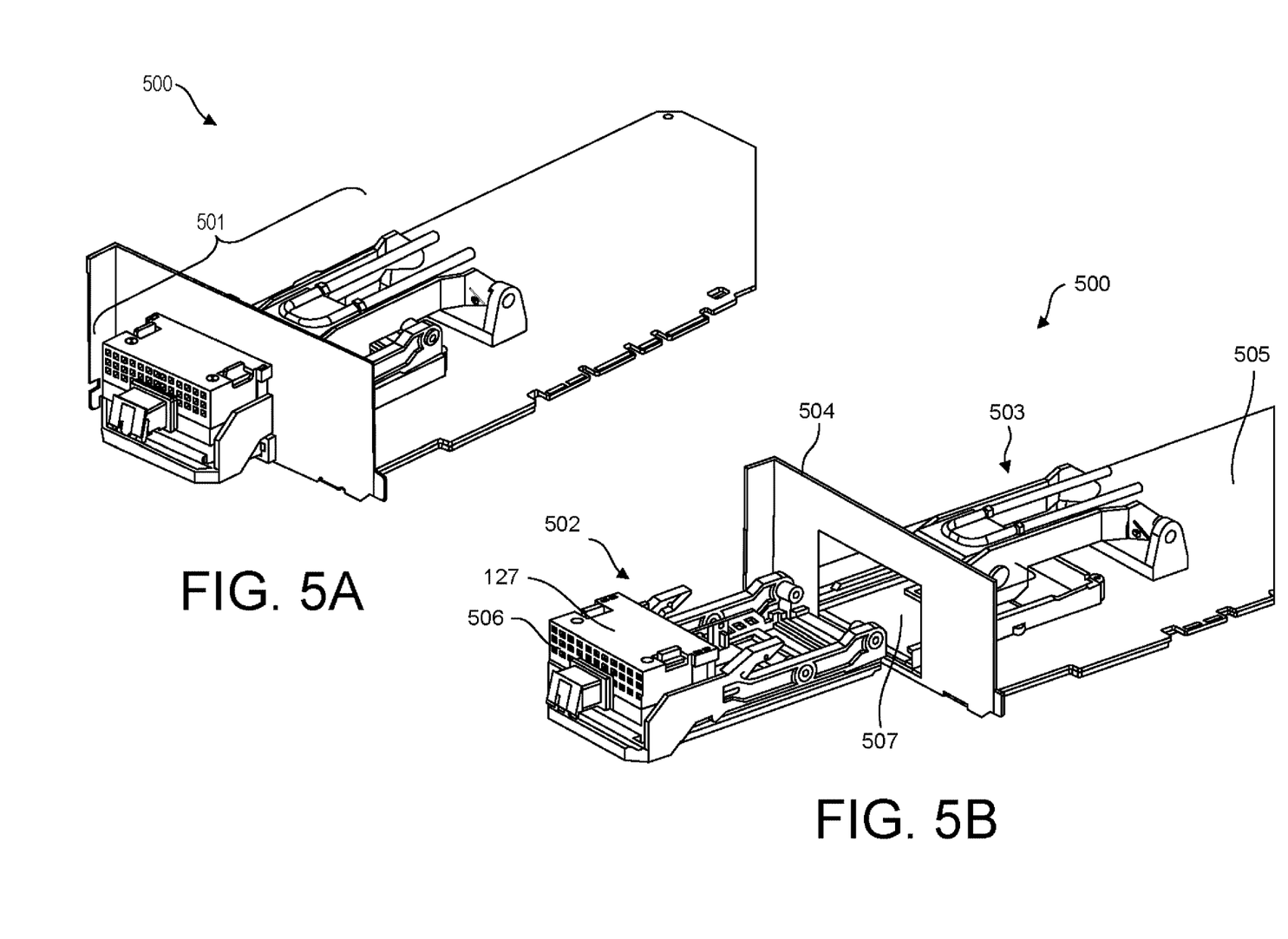
FIG. 5A is an illustration of a single bay of a computing system which integrates a liquid-cooled transceiver assembly according to one implementation of the present disclosure.
FIG. 5B is an illustration of a disassembled liquid-cooled transceiver assembly with the removable communications module at an entrance of the single bay displayed in FIG. 5A.

As discussed, the faceplate connector 107 can also facilitate the connection of an external cable. In the implementation shown, the faceplate connector 107 is a component of front compartment 123. The front compartment 123 may be disassembled by retaining screws 131 such that any of various interchangeable connector bulkheads 127 can be installed. Interchangeable connector bulkhead 127 may have perforations (labeled in FIG. 5) to allow for air cooling.

Further, liquid-cooled transceiver assembly 100 comprises components that facilitate the engagement and disengagement of the hot-pluggable assembly 101 to and from the receiving bay assembly 102. In particular, the hot-pluggable assembly 101 includes a lever assembly 121 which a user can manually operate to effect engagement of the hot-pluggable assembly 101 to the receiving bay assembly 102. Similarly, a user can manually operate the latch tabs 126 are coupled to compression spring 105 to effect disengagement of the hot-pluggable assembly 101 from the receiving cage assembly 102.

Figure 2A:
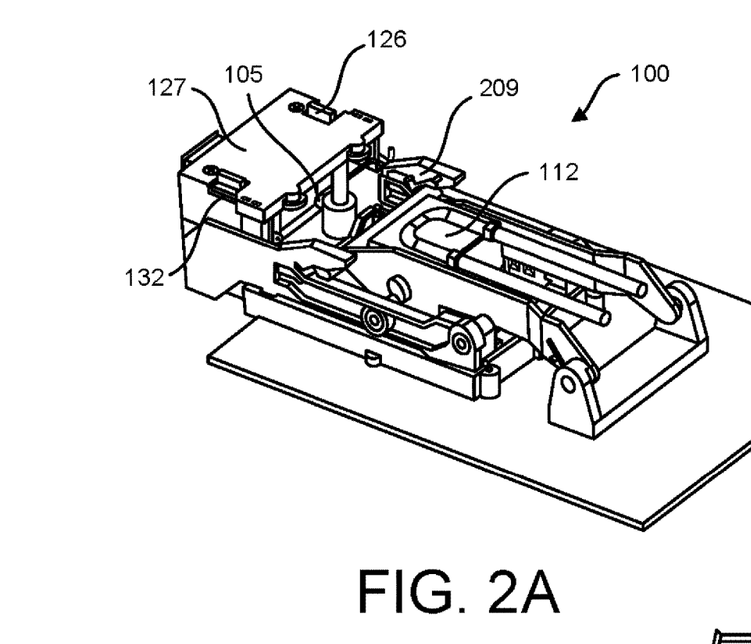
FIG. 2A is a perspective view of a liquid-cooled transceiver assembly according to one implementation of the present disclosure.
Figure 2B:
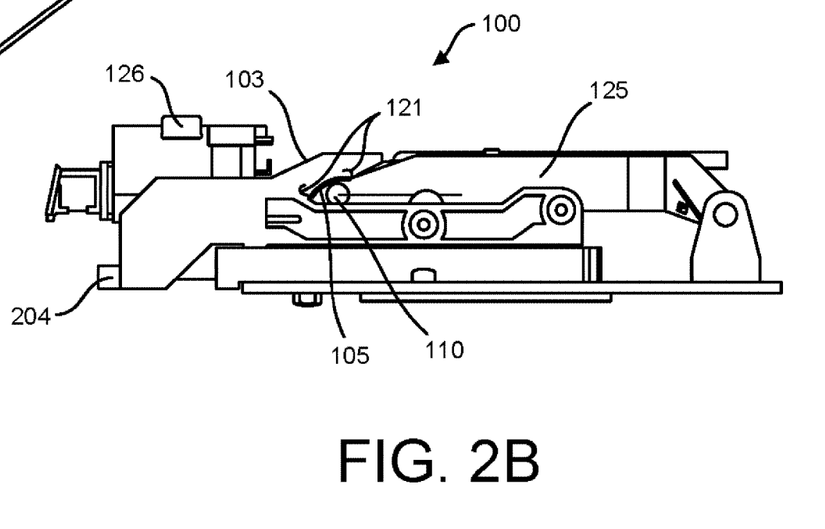
FIG. 2B is a side view of a liquid-cooled transceiver assembly according to one implementation of the present disclosure.

As will be described in more detail herein, when the lever assembly 121 is engaged, electrical contacts (see FIG. 2) on the bottom of the module board 129 mates with electrical contacts on the electrical socket 114.

The lever assembly 121 may include one or more lever arm(s) 104, lever bar(s) (labeled in FIG. 2), and lever hook(s) 103. The lever hooks 103 can mate with and pull down an engagement bar 110 of the receiving bay assembly 102 during an engagement sequence as will be discussed below.

In some implementations, the lever assembly 121 may comprise contoured portions. For example, lever assembly 121 may have a U-shaped lever handle, including a lever arm 104 located at each side of the frame of the lever assembly 121 and pivotally attached to the frame by its ends and an actuating portion joining both lever arms 104 by its opposite end. The lever assembly 121 can allow for a proper mechanism to hold, latch, and unlatch hot-pluggable assembly 101. Notably, the lever arm 104 of the lever assembly 121 is in its resting "up" position when it is not installed and latched in a receiving bay assembly 102. The lever assembly 121 allows a user to push the lever arm 104 down when a hot-pluggable assembly 101 is to be installed and latched in a receiving bay assembly 102. A user may squeeze the latch tabs 126 to disengage the latches, where the lever arm 104 and the lever assembly 121 will pop up to its resting "up" position to uninstall a hot-pluggable assembly 101 from a receiving bay assembly 102.

In some implementations, a downward motion of a pivoted lever arm 104 of the lever assembly 121 causes a module board 129 upon which the co-packaged assembly device 124 is disposed on to move in a vertical direction which causes the module board 129 to move along an inner wall of an alignment member 113 of the receiving bay assembly 102.

In addition, the lever assembly 121 is also pivotally coupled to the hot-pluggable assembly 101. In the embodiment shown in FIG. 1, hot-pluggable assembly 101 comprises pivot members 130 that are fastened to alignment members 122 which may also function as a base structure of the hot-pluggable assembly 101. During an engagement sequence, a lever (labeled in FIG. 2) can be lifted such that the lever assembly 121 move upwards about the pivot members 130. As such, during an engagement or disengagement sequence, a portion of the lever assembly 121 can be moved upwards or downwards relative to the pivot members 130 as should be appreciated by those having ordinary skill in the art. In one implementation, hot-pluggable assembly 101 comprises two pivot members 130, one on two sides of the assembly 101. However, the present disclosure may comprise more or less than two pivot members 130. In one implementation, pivot members 130 are components of the lever assembly 121 whereas in other implementations, the pivot members 130 are components of the hot-pluggable assembly 101 but are not components of the lever assembly 121.

The lever hooks 103 may be fashioned to mate with the engagement bar 110 on the receiving bay assembly 102. The lever hooks 103 may have one or more slopes on internal portions (labeled in FIG. 4) thereof. In addition, lever hooks 103 may also have curved portions on internal portions thereof. In some implementations, the curved portions on the internal portions of the lever hooks 103 have arc dimensions that complement the perimeter dimensions of the engagement bar 110 to effect sufficient mating thereto. In one implementation, each of the lever hooks 103 have a single slope and a single curved portion on internal portions thereof. In addition, the lever hooks 103 may be equipped with spring holders (labeled in FIG. 2) to effectively bind the compression spring 105 to the lever hooks 103.

Hot-pluggable assembly 101 also comprises alignment members 122. The alignment members 122 are fashioned to mate with the alignment members 113 of the receiving bay assembly 102 during an insertion sequence. In some implementations, the alignment members 122 are guides.

Furthermore, receiving bay assembly 102 includes a system board 120, an electrical socket 114 disposed on a surface of the system board 120, a plurality of alignment members 113 (of which one is labeled in FIG. 1) disposed on the system board 120, an engagement assembly 125 disposed on the system board 120, and a heat extraction assembly 119 connected to the engagement assembly 125 and disposed above the electrical socket 114 via the system bracket 117.

Notably, the cold-plate device 112 component of the heat extraction assembly 119 can cool power devices (e.g., signal conversion chip 106). In some implementations, cold-plate device 112 localizes the cooling of power electronics by transferring heat from the power device to a liquid (e.g., flowing through liquid line pair 116) that flows to a remote heat exchanger. In some implementations, cold-plate device 112 can reduce the size of heat sinks due to high heat transfer coefficients which reduce the temperature of power devices (e.g., signal conversion chip 106). In addition, the inner cavity of cold-plate device 112 may comprise a plurality of internal micro-fins and other features to improve the cold-plate device's 112 ability to dissipate heat. Furthermore, the heat extraction assembly 119 also includes liquid line pair 116 which keeps the cold-plate device 112 cooled to effectively dissipate heat from the signal conversion chip 106 disposed on the co-packaged assembly 124. In some examples, the cold-plate device 112 may also cool other components such as voltage regulators (not shown) on the module board 129.

The engagement assembly 125 has an engagement arm 111 that is coupled to the cold-plate device 112. As shown, the engagement arm 111 and cold-plate device 112 are located at the first end of the engagement assembly 125, while a second end of the engagement assembly 125 is pivotally connected to the system board 120 by a system bracket 117. The engagement assembly 125 is configured to engage with the lever assembly 121 as the hot-pluggable assembly 101 is slid into engagement with the alignment members 113. Specifically, the lever hooks 103 and the engagement arm 111 are configured such that the lever hooks 103 contact and hook the engagement arm 111 as the hot-pluggable assembly 101 is slid towards the engagement assembly 125. When the engagement assembly 125 is engaged with the lever assembly 121, the first end of the engagement assembly 125 can be pulled down in response to a downward movement of the lever assembly 121 which in turns pulls down the cold-plate device 112 to contact a signal conversion chip 106 that is disposed on the co-packaged assembly 124.

Further, system bracket 117 pivotally connects the engagement assembly 125 to the system board 120, for example via pivot pins 118. Notably, system bracket 117 can facilitate the engagement bar 110 mating with lever hook(s) 103 of the lever assembly 121. In other examples, the system bracket 117 may not be mounted on the system board 120 (e.g., the system bracket 117 may be mounted on a system mechanical frame or system cooling infrastructure). In one implementation, system bracket 117 also defines the displacement height of the engagement assembly 125 from the system board 120. The displacement height of the engagement assembly 125 enables the cold-plate device 112 to be in a position to contact and apply positive pressure to the co-packaged assembly 124 once the hot-pluggable assembly 101 is fully engaged with the receiving bay assembly 102.

Receiving bay assembly 102 also includes liquid line pair 116 that are coupled to the cold-plate device 112. As shown in FIG. 1, a liquid line pair 116 is stationed on top of the cold-plate device 112. The liquid line pair 116 may consist of a flexible liquid supply line carrying cool liquid and a flexible liquid return line carrying heated liquid. In some implementations, the liquid line pair 116 is coupled to a liquid source (e.g. chiller or other chilling apparatus) which circulates liquid through the liquid line pair 116 to maintain a low temperature (e.g., 60 degrees Fahrenheit/15.556 Celsius) of the cold-plate device 112 to adequately cool the co-packaged assembly 124 (e.g., particularly the signal conversion chip 106). The liquid line pair 116 may be equipped with leak-proof couplings 115 to couple with the cold-plate device 112.

Below the cold-plate device 112 is an electrical socket 114. The electrical socket 114 may be a land grid array (LGA) socket. The electrical socket 114 can electrically connect with the co-packaged assembly 124 when the liquid-cooled transceiver assembly 100 is fully assembled to operate as a single transceiver assembly.

The receiving bay assembly 102 may be also equipped with alignment members 113. In some implementations, the alignment members 113 are embodied as guide rails. As shown, the alignment members 113 are fashioned to mate with alignment members 122 of the hot-pluggable assembly 101 during an insertion sequence.

FIG. 2A is a perspective view of a liquid-cooled transceiver assembly 100 according to one implementation of the present disclosure. FIG. 2A displays a result of inserting a hot-pluggable assembly 101 into a receiving bay assembly 102.

FIG. 2B is a side view of a liquid-cooled transceiver assembly 100 according to one implementation of the present disclosure. As shown, the side view of the liquid-cooled transceiver assembly 100 exposes a manner in which an engagement bar 110 mates with a lever hook 103 of the lever assembly 121. In some implementations, the engagement bar 110 mechanically contacts a compression spring 105 that is fitted within the contour of the lever hook 103. The compression spring 105 can provide sufficient (e.g., positive) pressure such that a cold-plate device 112 can provide sufficient positive pressure on the co-packaged assembly 124 (shown in FIG. 1) to maintain thermal contact. In addition, a lever assembly 121 comprises spring holders 209 on each lever hook 103 to latch the compression spring 105 thereto. Spring holders 209 may comprise peg members (not shown) with insertion grooves (not shown) that fit and retain ends of the compression spring 105.

The lever assembly 121 may operate by enabling a user to push down on the lever bar 204 thereby causing the lever hook(s) 103 to pull on the engagement bar 110 which in turns forces the engagement assembly 125 downwards such that the cold-plate device 112 contacts and applies a positive pressure on a signal conversion chip 106 of the co-packaged assembly 124. A user can engage the lever assembly 121 to a locked position. When the liquid-cooled transceiver assembly 100 is fully assembled, the lever assembly 121 is engaged to a locked position.

Additionally, FIGS. 2A and 2B show a pair of latch tabs 126 and a lever bar 204 which can be used to affect a disengagement of the hot-pluggable assembly 101 from the receiving bay assembly 102. In one implementation, a user can disengage the liquid-cooled transceiver assembly 100 by squeezing the latch tabs 126 (e.g., with two fingers). In other implementations, a user may manually operate the lever bar 204 of the lever assembly 121 to affect an engagement or disengagement process of the liquid-cooled transceiver assembly 100.

In some implementations, to effect engagement, a user can push down on the lever bar 204 when the hot-pluggable assembly 101 is fully inserted into the receiving bay assembly 102. The latch tabs 126 along the latches 132 are then extended outward of the interchangeable connector bulkhead 127 to secure the hot-pluggable assembly 101 in the receiving bay assembly 102. In contrast, a user can squeeze the latch tabs 126 where the lever bar 204 will be returned to upward position because of the compression spring 105. The latches 132 are also retracted inward of the interchangeable connector bulkhead 127, effectively unlatching the hot-pluggable assembly 101 from the receiving bay assembly 102. The user can then pull the lever bar 204 to disengage the hot-pluggable assembly 101 from the receiving bay assembly 102. In one embodiment, a pair of latch tabs 126 on the interchangeable connector bulkhead 127 cooperates with the compression spring 105 to latch and unlatch the lever assembly 121.

Figure 3:
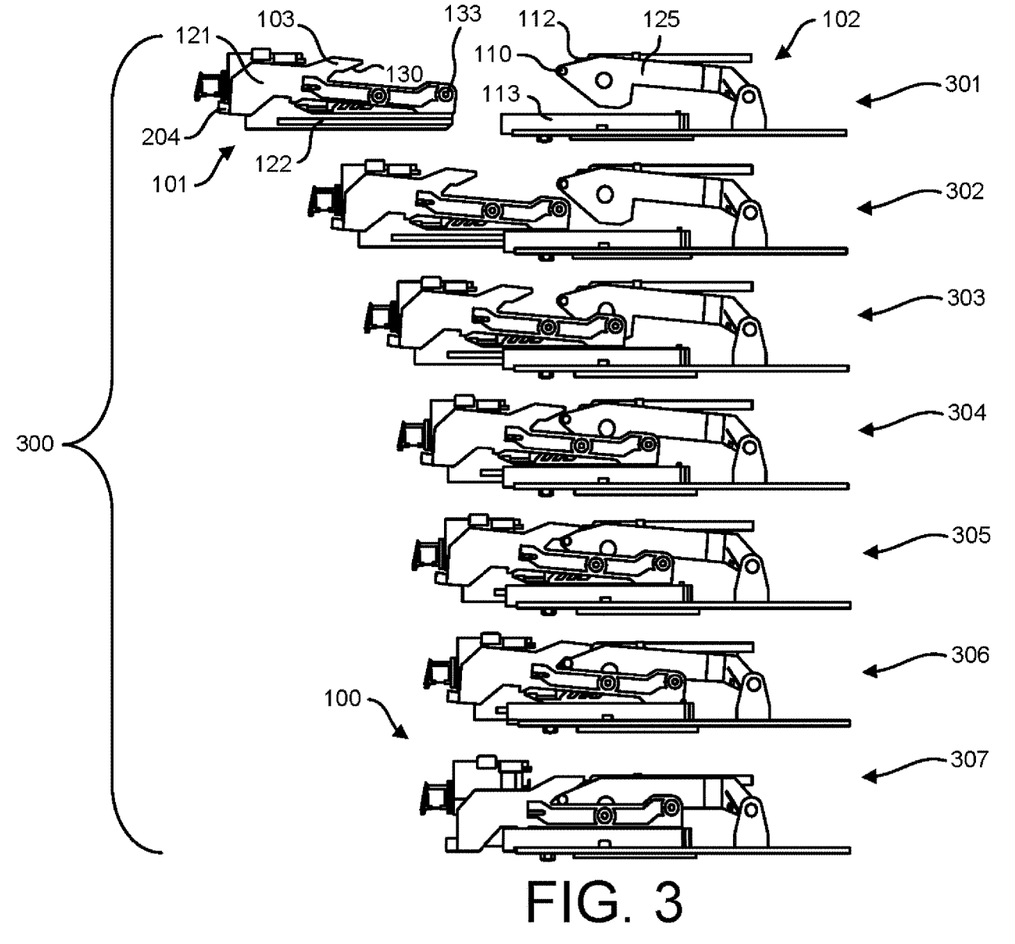
FIG. 3 is an illustration of a removable communications module insertion sequence according to one implementation of the present disclosure.

FIG. 3 is an illustration of removable communications module (e.g., hot pluggable assembly 101) insertion sequence 300 according to one implementation of the present disclosure. The insertion sequence 300 is displayed by steps 301-307. In some implementations, the insertion sequence 300 can be accomplished in a single motion manually performed by a user.

As illustrated, the insertion sequence 300 begins with step 301 which shows that the hot-pluggable assembly 101 is set to be inserted into receiving bay assembly 102. Next, step 302 illustrates the movement of hot-pluggable assembly 101 into receiving bay assembly 102. In some implementations, step 302 may be characterized as aligning the alignment member(s) 122 of the hot-pluggable assembly 101 with alignment member(s) 113 of the receiving bay assembly 102. In addition, a lever bar 204 component of the hot-pluggable assembly 101 is engaged by a user in an upwards direction such that the lever assembly 121 moves upwards relative to a pivot member 130.

Moving forward, the hot-pluggable assembly 101 further contacts the receiving bay assembly 102 at step 303. In particular, the lever assembly 121 makes contact with the engagement assembly 125. Notably, the lever assembly 121 is disposed at an angle during the beginning phase of the insertion sequence 300 for the cold-plate device 112 to be above the co-packaged assembly 124 (labeled in FIG. 1).

As the insertion sequence 300 proceeds, the cold-plate device 112 makes further contact with the receiving bay assembly 102 such that the lever hooks 103 contact the engagement bar 110 (step 304). In some implementations, the lever assembly 121 includes two lever hooks 103 such that the engagement bar 110 contacts and mates with the lever assembly 121 at two locations (e.g., on the engagement bar 110).

As the insertion sequence 300 proceeds (step 305), the engagement bar 110 slides along the inside of lever hook 103 (e.g., angled portion 133) towards its locked position which pulls the engagement bar 110 slightly downward towards the co-packaged assembly device 124.

The engagement bar 110 finally reaches its fully engaged position within the lever hooks 103 (step 306) such that the hot-pluggable assembly 101 and the receiving bay assembly 102 are ready to be assembled as a liquid-cooled transceiver assembly 100.

In step 307, the lever bar 204 is pulled downwards, causing the lever arm 104 (labeled in FIG. 1) to pivot downwards which causes the co-packaged assembly 124 (labeled in FIG. 1) to mate with electrical socket 114 (see FIG. 1). Moreover, as the lever arm 104 pivots downward, the engagement bar 110 is also pulled downward which causes the engagement assembly 125 to pivot downwards. In addition, the cold-plate device 112 comes into contacts with the co-packaged assembly 124 (labeled in FIG. 1).

Figure 4:
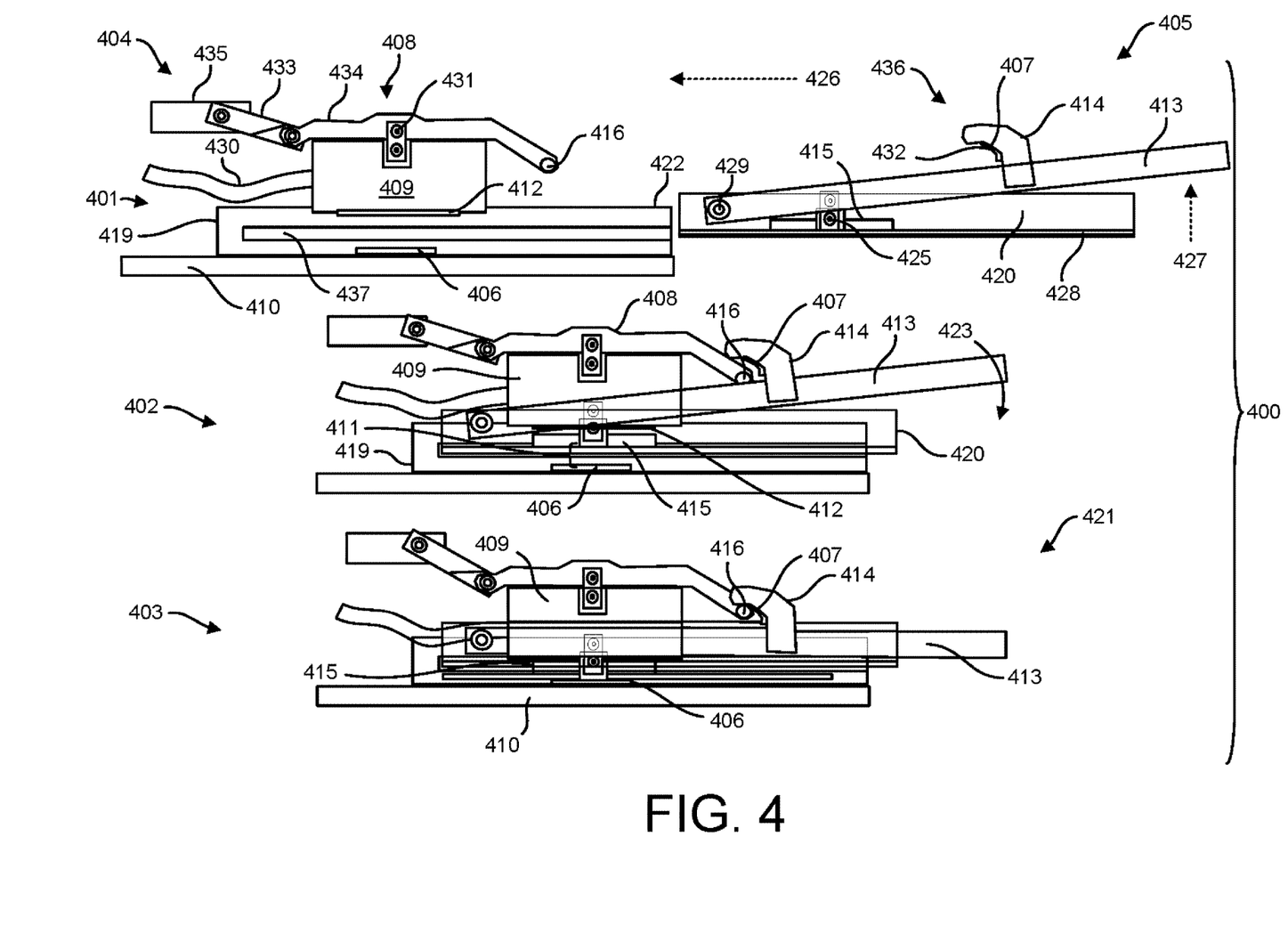
FIG. 4 is an illustration of a lever engagement sequence of the hot-pluggable system according to one implementation of the present disclosure.

FIG. 4 is an illustration of a lever engagement sequence 400 of the hot-pluggable system according to one implementation of the present disclosure. Engagement sequence 400 is shown in steps 401, 402, 403. In some implementations, steps 401, 402, 403 are accomplished in a single motion by a user. Notably, FIG. 4 illustrates a side view of an alternative embodiment of a hot-pluggable assembly 405 and a receiving bay assembly 404.

Hot-pluggable assembly 405 may comprise a lever assembly 436 that has a lever platform 413, a lever hook 414 coupled thereto, and a hinged post 425 that mechanically connects the lever platform 413 to a module board 428 of the hot-pluggable assembly 405. During the engagement sequence 400, hot-pluggable assembly 405 may be elevated such that the module board 428 is aligned with a cavity 437 of the inner wall of the alignment member 422.

In addition, one or more pivot members 429 may be coupled to or fashioned on the lever platform 413. In one implementation, pivot members 429 are coupled to a guide 420 on two sides of the module board 428. In addition, a lever hook 414 has a single-sloped portion 432 on an inner surface thereof that enables the lever hook 414 to effectively mate with the engagement bar 416 of the receiving bay assembly 404.

In addition, the receiving bay assembly 404 features a cold-plate device 409 that is coupled to an engagement device 408 that is mechanically connected to the cold-plate device 409 by a coupling mechanism 431. Notably, the engagement device 408 may be multi-segmented. In the embodiment shown, engagement device 408 comprises a cold-plate device coupling section 434 connected to an engagement arm section 435 by coupling component 433. The engagement arm section 435 may be coupled to the substrate 410. In addition, liquid line(s) 430 may extend through the cold-plate device 409. The liquid line(s) 430 may be coupled to a liquid source (e.g. chiller or other chilling apparatus) which circulates liquid through the liquid line to maintain a low temperature of the cold-plate device 409 to adequately cool the co-packaged assembly 415.

Engagement sequence 400 begins with step 401, aligning the hot-pluggable assembly 405 with the receiving bay assembly 404 and then moving the hot-pluggable assembly 405 towards the receiving bay assembly 404 in a direction 426. Accordingly, in some implementations, the module insertion direction is horizontal as shown by direction 426 although the lever operating and module mating to electrical socket 406 direction is vertical as shown by direction 427.

In one implementation, aligning the hot-pluggable assembly 405 with the receiving bay assembly 404 includes aligning the guide(s) 420 of the hot-pluggable assembly 405 to cooperate with the alignment members 422 of the receiving bay assembly 404. After the alignment, the hot-pluggable assembly 405 moves in direction 426 towards the receiving bay assembly 404 such that the hot-pluggable assembly 405 and the receiving bay assembly 404 are coupled together as a liquid-cooled transceiver assembly 421.

Step 402 proceeds with physically inserting the hot-pluggable assembly 405 into the receiving bay assembly 404. Although the bottom surface of the cold-plate device 409 is shown to be substantially parallel to the substrate 410, during step 402, the cold-plate device 409 may arrive at this point from an angle as the hot-pluggable assembly 405 is inserted into the receiving bay assembly 404.

Once the hot-pluggable assembly 405 is inserted into the receiving bay assembly 404, the co-packaged assembly 415 is disposed over the electrical socket 406 by a distance defined by gap 411. In some implementations, cold-plate device 409 may be disposed with a thermal interface material (TIM) 412 on a bottom surface and may be aligned over the co-packaged assembly 415. In addition, as shown, an engagement device 408 is coupled to the cold-plate device 409.

In some implementations, the back wall 419 of the alignment members 422 on the receiving bay assembly 404 impedes the lateral motion of the hot-pluggable assembly 405 beyond a certain point during the insertion sequence.

Next, step 403 illustrates the point at which the hot-pluggable assembly 405 has reached the maximum lateral point within the receiving bay assembly 404. A user can maneuver the lever platform 413 in an angular direction 423 (shown in step 402) such that lever platform 413 can no longer be pushed further downward. As shown in step 403, the compression spring 407 fitted within the lever hook 414 allows the lever platform 413 to be "over-driven" which in turn provides adequate pressure for the cold-plate device 409 on top of the integrated circuit on the co-packaged assembly 415. In addition, the lever platform 413 also pushes down the hot-pluggable assembly 405, allowed by the hinged post 425, in order for the contact pads on the bottom surface (not shown) of the module board 428 to maintain electrical connections with the electrical socket 406. The lever hook 414 mates with the engagement bar 416 as shown. In addition, the positive pressure applied by the cold-plate device 409 can affect sufficient thermal contact between the cold-plate device 409 and the signal conversion chip (not shown) of the co-packaged assembly 415 to effectively dissipate heat.

FIG. 5A is an illustration of a single bay 500 of a computing system which integrates a liquid-cooled transceiver assembly according to one implementation of the present disclosure. Accordingly, the present disclosure may be embodied into a single or multi-bay computing system. In some implementations of the present disclosure, a computing system includes a plurality of bays which stations one or more hot-pluggable, liquid-cooled transceiver assemblies 501.

FIG. 5B is an illustration of a disassembled liquid-cooled transceiver assembly with the removable communications module at an entrance of the single bay 500 displayed in FIG. 5A. Bay entrance 504 includes a cavity 507 which allows a user to insert a hot-pluggable assembly 502 into computer bay 500 to mate with receiving bay assembly 503. FIG. 5B also exposes a plurality of perforations 506 in the Interchangeable connector bulkhead 127 to allow for air cooling of components on the system board 505.

The system board 505 can be fashioned for various system applications. For example, system board 505 may function as an adapter I/O card which complies with a triple-high PCIe/PECFF protocol. In other implementations, system board 505 is a standard module board for a switch device or conventional computing system.

Although the present disclosure has been described in detail, it should be understood that various changes, substitutions and alterations can be made without departing from the spirit and scope of the disclosure. Any use of the words "or" and "and" in respect to features of the disclosure indicates that examples can contain any combination of the listed features, as is appropriate given the context.

Phrases and parentheticals beginning with "e.g." or "i.e." are used to provide examples merely for the purpose of clarity. It is not intended that the disclosure be limited by the examples provided in these phrases and parentheticals. The scope and understanding of this disclosure may include certain examples that are not disclosed in such phrases and parentheticals.

While illustrative implementations of the application have been described in detail herein, it is to be understood that the inventive concepts may be otherwise variously embodied and employed, and that the appended claims are intended to be construed to include such variations, except as limited by the prior art.

Reference throughout this specification to "one implementation" or "an implementation" means that a particular feature, structure, or characteristic described in connection with the implementation is included in at least one implementation of the present disclosure. Thus, the appearances of the phrases "in one implementation" or "in some implementations" in various places throughout this specification are not necessarily all referring to the same implementation. Furthermore, the particular features, structures, or characteristics may be combined in any suitable manner in one or more implementations.

In the foregoing specification, a detailed description has been given with reference to specific example implementations. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of implementation and other exemplarily language does not necessarily refer to the same implementation or the same example, but may refer to different and distinct implementations, as well as potentially the same implementation.

What is claimed is:

1. A removable communications module assembly, comprising:
   a faceplate connector to receive a signal from an external device;
   a signal conversion chip coupled to the faceplate connector; and
   a lever assembly that is operable to engage a receiving bay assembly having an electrical socket such that the signal conversion chip is aligned with and makes an electrical connection with the electrical socket,
   wherein the lever assembly is operable to provide positive pressure such that the signal conversion chip can maintain a thermal connection with a cold-plate component of an assembly, and
   wherein the lever assembly includes a lever hook that fits a compression spring which is operable to provide positive pressure such that the signal conversion chip can maintain a thermal connection with a cold-plate component of a receiving cage assembly.

2. The removable communications module assembly of claim 1, wherein the signal conversion chip is a component of a co-packaged assembly.

3. The removable communications module assembly of claim 1, wherein the faceplate connector is integrated within an interchangeable connector bulkhead.

4. A receiving assembly to receive a removable communications module, comprising:
   a system board;
   an electrical socket disposed on a surface of the system board;
   an alignment assembly disposed on the system board and configured to engage the removable communications module so as to align the electrical contacts on a bottom surface of a module board with the electrical socket;
   a heat extraction assembly having a cold-plate device which is disposed above the electrical socket; and
   an engagement assembly having an engagement arm coupled to the heat extraction assembly, the engagement assembly being operable to engage with a lever assembly of the removable communications module as the removable communications module is engaged with the alignment assembly such that the lever assembly forces the engagement arm downwards such that the cold-plate device contacts and applies a positive pressure on a signal conversion chip of the removable communications module.

5. The receiving assembly of claim 4, wherein the heat extraction assembly further comprises a flexible liquid line coupled to the cold-plate device.

6. The receiving bay assembly of claim 4, wherein the positive pressure applied to the cold-plate device establishes thermal contact with the signal conversion chip that is disposed on a removable communications assembly that is fitted into the receiving assembly.

7. The receiving bay assembly of claim 4, wherein the alignment assembly comprises a pair of guide rails.

8. The receiving bay assembly of claim 4, wherein the system board is an adaptor input/output card.

9. The receiving bay assembly of claim 4, wherein the engagement assembly comprises a pivotable mounting bracket that is operable to move the engagement arm to engage with a lever assembly.

10. A liquid-cooled transceiver assembly, comprising:
    a hot-pluggable assembly, comprising:
       an electrical or optical transceiver faceplate connector unit;
       a System-on-Chip device, comprising:
          a signal conversion chip;
          an optical connector; and
          an optical jumper cable that is coupled between the signal conversion unit and the optical connector to transmit light signals there between; and
       a lever assembly which is operable to engage a receiving bay assembly such that the signal conversion chip is aligned and makes contact with an electrical socket; and
    the receiving bay assembly, comprising:
       a system board;
       an electrical socket disposed on a surface of the system board;
       a heat extraction assembly having a cold-plate device which is disposed above the electrical socket; and
       an engagement assembly having an engagement arm coupled to the heat extraction assembly, the engagement assembly being operable to engage with the lever assembly of the hot-pluggable assembly as the hot-pluggable assembly is engaged with an alignment assembly such that lever assembly forces the engagement arm downwards such that the cold-plate device contacts and applies a positive pressure on the signal conversion chip of the hot-pluggable assembly.

11. The liquid-cooled transceiver assembly of claim 10, wherein the lever hook fits a compression spring that is operable to provide positive pressure such that the signal conversion chip can contact and maintain an electrical connection with the electrical socket.

12. The liquid-cooled transceiver assembly of claim 10, further comprising a pair of latch tabs on the electrical or optical transceiver faceplate connector unit that cooperate with the compression spring to latch and unlatch the lever assembly.

13. The liquid-cooled transceiver assembly of claim 10, wherein an engagement of the lever assembly creates an electrical blind mate between the hot-pluggable assembly and the receiving bay assembly.

14. The liquid-cooled transceiver assembly of claim 10, wherein the electrical or optical transceiver faceplate connector unit is an interchangeable unit.

15. The liquid-cooled transceiver assembly of claim 10, wherein the liquid line is coupled to a liquid source.

16. The liquid-cooled transceiver assembly of claim 10, wherein the alignment member is to align the signal conversion chip with the electrical socket during an insertion sequence of the hot-pluggable assembly into the receiving bay assembly, the alignment assembly comprises a first alignment member disposed on the hot-pluggable assembly which is to physically cooperate with a second alignment member that is disposed on the receiving bay assembly.

17. The liquid-cooled transceiver assembly of claim 16, wherein the second alignment member comprises a back wall that limits a lateral movement of the hot-pluggable assembly into the receiving bay assembly during the insertion sequence.

18. The liquid-cooled transceiver assembly of 10, wherein the alignment assembly comprises guide rails disposed on the system board which allow the hot pluggable assembly to engage the receiving bay assembly without interfering with the electrical socket and other components on the system board.

19. The liquid-cooled transceiver assembly of claim 10, wherein a downward motion of a pivoted lever arm of the lever assembly causes a module board upon which the System-on-Chip device is disposed on to move in a vertical direction which causes the module board to move along an inner wall of the alignment assembly of the receiving bay assembly.

* * * * *